(12) United States Patent
Shinohara (10) Patent No.: US 7,545,226 B2
(45) Date of Patent: Jun. 9, 2009

(54) MAGNETRON OSCILLATOR

(75) Inventor: Kibatsu Shinohara, Kanagawa (JP)

(73) Assignee: Nihon Koshuha Co., Ltd., Kanagawa (JP)

(*) Notice: Subject to any disclaimer, the term of this patent is extended or adjusted under 35 U.S.C. 154(b) by 360 days.

(21) Appl. No.: 10/572,532

(22) PCT Filed: Sep. 15, 2005

(86) PCT No.: PCT/JP2005/017033

§ 371 (c)(1),
(2), (4) Date: Mar. 17, 2006

(87) PCT Pub. No.: WO2006/033278

PCT Pub. Date: Mar. 30, 2006

(65) Prior Publication Data

US 2008/0231380 A1    Sep. 25, 2008

(30) Foreign Application Priority Data

Sep. 24, 2004  (JP) ............................. 278051/2004

(51) Int. Cl.
*H03B 9/10*  (2006.01)
*H03L 7/24*  (2006.01)

(52) U.S. Cl. .................. 331/88; 331/5; 331/47; 331/90

(58) Field of Classification Search ............ 331/5, 331/47, 86–91
See application file for complete search history.

(56) References Cited

U.S. PATENT DOCUMENTS

| 2,748,277 | A | * | 5/1956 | Haagensen | 331/78 |
| 2,820,197 | A | * | 1/1958 | Donal, Jr. | 332/161 |
| 2,949,581 | A | * | 8/1960 | Kline | 331/91 |
| 3,139,592 | A | * | 6/1964 | Sisson | 331/5 |

(Continued)

FOREIGN PATENT DOCUMENTS

JP         52-119810 A    10/1977

(Continued)

OTHER PUBLICATIONS

"Techniques of Microwave Plasma", edited by Electric Society Microwave Plasma Investigation Expert Committee, Ohm, Sep. 25, 2003, pp. 240-243.

*Primary Examiner*—Robert Pascal
*Assistant Examiner*—Levi Gannon
(74) *Attorney, Agent, or Firm*—Blakely, Sokoloff, Taylor & Zafman (57) ABSTRACT

A magnetron (2), a launcher (4) which extracts the output power of the magnetron (2), an impedance generator (5) having one terminal connected to the output terminal of the launcher (4), and a reference signal supplier (6) connected to the other terminal of the impedance generator (5) are included. The reference signal supplier (6) supplies, to the magnetron (2), a reference signal lower in electric power and stabler in frequency than the output from the magnetron (2). The oscillation frequency of the magnetron (2) is locked to the frequency of the reference signal by injection of the reference signal. The impedance generator (5) can reduce the change width of the oscillation frequency of the magnetron (2) by adjusting the load impedance of the magnetron (2). This implements a magnetron oscillator (1) which has high frequency stability and does not fluctuate the frequency even when the output power is changed.

13 Claims, 9 Drawing Sheets

U.S. PATENT DOCUMENTS 6,544,380 B2 * 4/2003 Tomoyasu et al. ..... 156/345.51
6,914,556 B1 * 7/2005 Nyswander ................. 342/204

FOREIGN PATENT DOCUMENTS

| | | |
|---|---|---|
| JP | 02-249301 A | 10/1990 |
| JP | 03-227124 A | 10/1991 |
| JP | 04-137481 A | 5/1992 |
| JP | 05-299024 A | 11/1993 |
| JP | 06-053743 A | 2/1994 |
| JP | 08-298460 A | 11/1996 |
| WO | WO 2004/068917 A | 8/2004 |

* cited by examiner

MAGNETRON OSCILLATOR

TECHNICAL FIELD

The present invention relates to a magnetron oscillator using a magnetron as an oscillating tube and, more particularly, to a magnetron oscillator in which a reference signal oscillator which is lower in output power and stabler in oscillation frequency than a magnetron is provided, and a reference signal oscillated by the reference signal oscillator is injected into the magnetron to lock (synchronize) the oscillation frequency of the magnetron to that of the reference signal oscillator, thereby improving the frequency stability of the magnetron.

BACKGROUND ART

A semiconductor oscillator using a transistor as an amplifier is one of microwave-band oscillators. This semiconductor oscillator is used in frequency bands up to about 1,000 MHz. Since, however, the types of semiconductor devices usable in a frequency band of 2,450 MHz necessary for plasma generation are few and they are expensive, semiconductor oscillators require very high costs.

2,450 MHz oscillators are classified into a klystron oscillator and magnetron oscillator. The klystron oscillator has a high frequency stability and high amplitude controllability. However, a klystron is expensive, and the cost of a power supply for driving the klystron is relatively high, so the whole apparatus including them requires a very high cost.

By contrast, the magnetron oscillator is available at a low cost because magnetrons up to an output power of about 10 kW required for plasma generation are mass-produced. Also, a magnetron driving power supply is simple in arrangement and can be manufactured at a low cost. Accordingly, many magnetron oscillators are used as, e.g., magnetron power supplies for plasma generation.

The characteristics of the magnetron used in the magnetron oscillator will be explained below.

Figure 12:
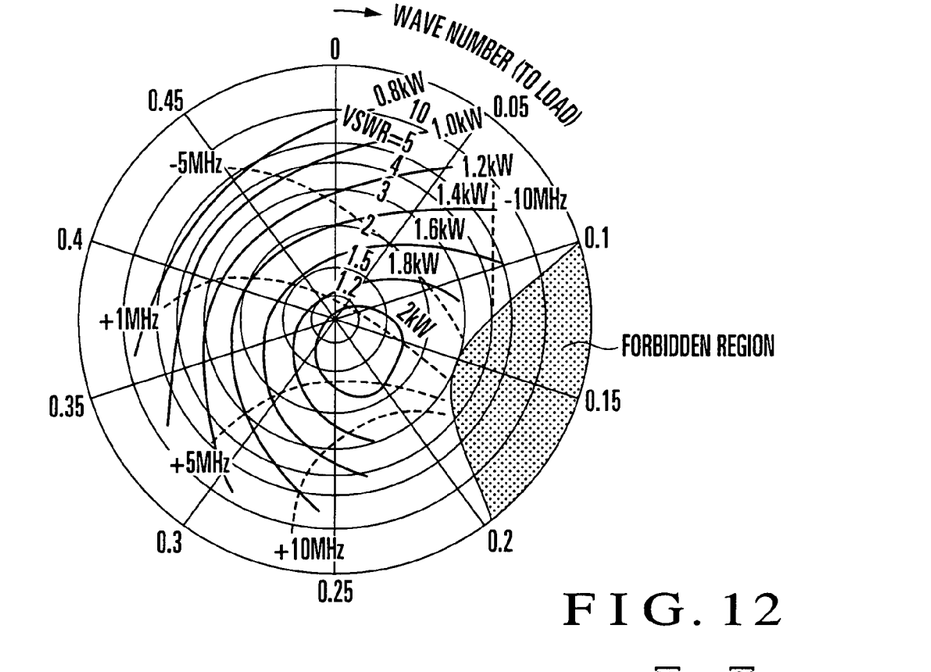
FIG. 12 is a Rieke diagram showing the load characteristics of the magnetron.

FIG. 12 is a Rieke diagram showing the load characteristics of the magnetron. In this diagram, the relationship between the output power, oscillation frequency, and load impedance obtained by connecting a load to the output terminal of a test launcher attached to the magnetron and changing the impedance of this load is displayed on a Smith chart under the conditions that the output power and frequency are constant. A graph when the output power is constant is indicated by the solid lines, and a graph when the frequency is constant is indicated by the dotted lines.

As shown in FIG. 12, the magnetron changes the output power and oscillation frequency in accordance with the load impedance. A phenomenon in which the oscillation frequency changes in accordance with the load impedance is called a "pulling phenomenon".

Figure 13:
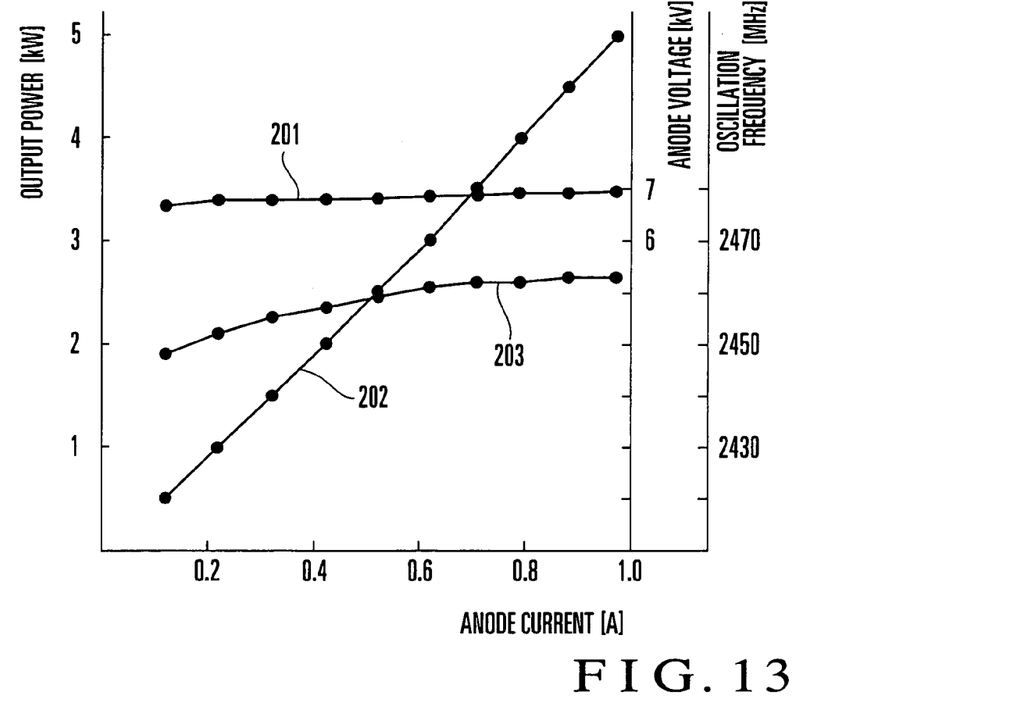
FIG. 13 is a performance chart showing the operation characteristics of the magnetron.

FIG. 13 is a performance chart showing the operation characteristics of the magnetron. This chart shows the changes in anode voltage, output power, and oscillation frequency when a matched load is connected to the output terminal of a test launcher attached to the magnetron, and the anode current is changed while the magnetron is in operation. Graphs 201, 202, and 203 respectively indicate the changes in anode voltage, output power, and oscillation frequency.

As indicated by the graphs 201 to 203 shown in FIG. 13, the anode voltage is substantially constant with respect to the anode current, the output power changes in substantially proportion to the anode current, and the oscillation frequency changes with the anode current although this change is smaller than standard values (the frequency change is 15 MHz, and the rate of change is 0.6%).

Also, when the anode current is changed to change the output power to be equal to or smaller than a certain value, the oscillation mode of the magnetron jumps to cause oscillation at a different frequency, and this makes the oscillation state unstable. This phenomenon is called "moding". If moding occurs, intermittent oscillation takes place, and the oscillation frequency is no longer constant, thereby causing the inconveniences that, e.g., a matching circuit or the like connected to the load side does not normally operate any longer (see reference 1 ("Techniques of Microwave Plasma" edited by Electric Society Microwave Plasma Investigation Expert Committee, Ohm, Sep. 25, 2003, pp. 240-243)).

DISCLOSURE OF INVENTION

Problems to be Solved by the Invention

As described above, the magnetron changes the oscillation frequency in accordance with the load impedance by the pulling phenomenon, and changes the oscillation frequency in accordance with the output power (anode current) as well. In addition, moding makes the oscillation frequency and oscillation state unstable in a region where the output power is low.

Accordingly, it is difficult to lock and stabilize the oscillation frequency of the magnetron oscillator using the magnetron, and this problem must be solved in order to use the magnetron oscillator as, e.g., a microwave power supply for generating a plasma.

To solve this problem, reference 2 (International Publication WO2004/068917) has proposed a technique by which a reference signal oscillator having an oscillation frequency stabler than that of the magnetron is provided, and a reference signal oscillated by the reference signal oscillator is injected into the magnetron to lock the oscillation frequency of the magnetron to the oscillation frequency (reference frequency) of the reference signal oscillator, and to make the frequency stability of the magnetron equal to that of the reference signal oscillator. Locking the oscillation frequency of an oscillator by injection of a reference signal is called "injection locking".

Injection locking is possible when the following relations hold.

$$BW = 2F_0/(Q_e \cdot G^{1/2}) \quad (1)$$

$$G = P_o/P_i \quad (2)$$

where

BW: the difference between the oscillation frequencies when injection locking is in operation and is not in operation $F_0$: the frequency (reference frequency) of the reference signal $Q_e$: the loaded Q of the magnetron $P_o$: the output power of the magnetron $P_i$: the power (injection power) of the reference signal to be injected into the magnetron If the output power (anode current) of the magnetron is increased, however, the value of G increases by equation (2), and the value of BW decreases by equation (1), thereby readily disabling injection locking, and making the oscillation frequency of the magnetron unstable.

The present invention has been made to solve these problems, and has as its object to provide a magnetron oscillator which has high frequency stability, and does not fluctuate the frequency even when the output power is changed.

Means for Solving the Problems

To achieve the above object, a magnetron oscillator according to the present invention is characterized by comprising a first magnetron, a launcher which extracts an output power of the first magnetron, an impedance generator which has one terminal connected to an output terminal of the launcher, and adjusts a load impedance of the first magnetron, and a reference signal supplier which is connected to the other terminal of the impedance generator, and supplies, to the first magnetron, a reference signal lower in electric power and stabler in frequency than the output from the first magnetron.

Effects of the Invention

In the present invention, it is possible, by injecting a reference signal into a magnetron, to lock the oscillation frequency of the magnetron to the frequency of the reference signal, and improve the frequency stability of a magnetron oscillator.

Also, the change width of the oscillation frequency can be reduced by adjusting the load impedance by using an impedance generator.

Accordingly, it is possible to lock the oscillation frequency to the frequency of the reference signal even when the output power of the magnetron is changed, and broaden the output power range within which the oscillation frequency is stable.

BEST MODE FOR CARRYING OUT THE INVENTION

An embodiment of the present invention will be described in detail below with reference to the accompanying drawings.

Figure 1:
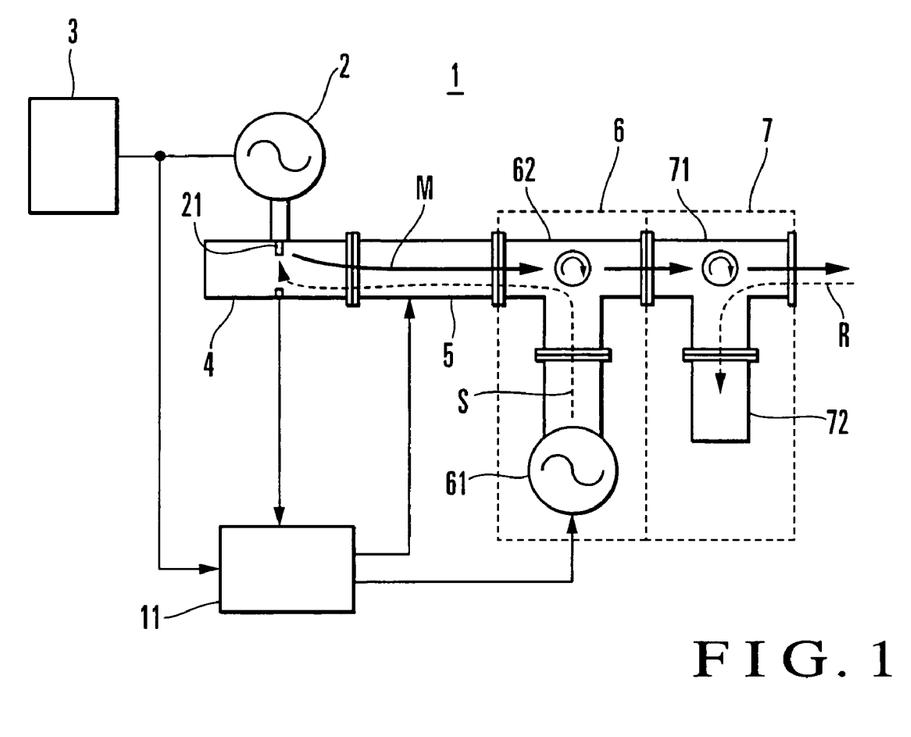
FIG. 1 is a block diagram showing the arrangement of a magnetron oscillator according to an embodiment of the present invention.

FIG. 1 is a block diagram showing the arrangement of a magnetron oscillator according to the embodiment of the present invention. A magnetron oscillator 1 according to this embodiment comprises a magnetron 2, magnetron power supply 3, launcher 4, impedance generator 5, reference signal supplier 6, isolator 7, and synchronous controller 11.

The magnetron 2 is an oscillating tube of the magnetron oscillator 1, and oscillates a microwave M. When the magnetron oscillator 1 is to be used as a microwave power supply for generating a plasma, it is possible to use the magnetron 2 having, e.g., an oscillation frequency of 2,450 MHz and an output power of a few kW to 10 kW.

The magnetron power supply 3 is a power supply which supplies a voltage and electric current to the heater and cathode of the magnetron 2. It is necessary to minimize frequency fluctuations caused by power fluctuations by using a highly stable switching regulator type power supply as the magnetron power supply 3.

The launcher 4 is a high-frequency coupler which efficiently extracts the output power from the magnetron 2, and comprises a rectangular waveguide having one shorted terminal. The magnetron 2 is located above the launcher 4, and an antenna 21, which projects inside the launcher 4, of the magnetron 2 radiates the microwave M.

The impedance generator 5 has a function to set the impedance at an arbitrary value, and also functions as a standing wave generator. Various types of impedance changing methods can be used. These methods are classified into, e.g., waveguide type methods and coaxial type methods in accordance with transmission lines used. The impedance generator 5 has one terminal connected to the output terminal of the launcher 4, and is used to adjust the load impedance of the magnetron 2.

The reference signal supplier 6 supplies a reference signal S to the magnetron 2, and has at least a reference signal oscillator 61 and three-terminal circulator 62.

The reference signal oscillator 61 is an oscillator which oscillates the reference signal S, and has a lower output power and stabler oscillation frequency than those of the magnetron 2. For example, an output power of a few Wats to a few tens Wats is obtained by performing amplification and multiplication as will be described later by using, e.g., a quartz oscillator or a DRO which uses dielectric resonator as master oscillation. The oscillation frequency of the reference signal oscillator 61, i.e., the frequency of the reference signal S is set at a desired frequency to which the oscillation frequency of the magnetron 2 is to be locked. For example, to lock the oscillation frequency of the magnetron 2 to 2,450 MHz, the reference signal S having 2,450 MHz is used.

The three-terminal circulator 62 is an irreversible member which transmits, with a low loss, the input power from a first terminal to a second terminal, the input power from the second terminal to a third terminal, and the input power from the third terminal to the first terminal, and does not transmit any power in the opposite directions. The first terminal is connected to the other terminal of the impedance generator 5, the second terminal is connected to the isolator 7, and the third terminal is connected to the reference signal oscillator 61. Accordingly, the reference signal S from the reference signal oscillator 61 is supplied to only the impedance generator 5, and the microwave M from the magnetron 2 is supplied from the impedance generator 5 to only the isolator 7. Note that a directional coupler or a simple branching or coupling device may also be used instead of the circulator 62. In this case, however, the degree of coupling, the load impedance, and the like are limited.

The isolator 7 absorbs a microwave (reflected power) R reflected by the load, and has a three-terminal circulator 71 and dummy load 72.

The three-terminal circulator 71 is an irreversible member similar to the three-terminal circulator 62 described above, and has a first terminal connected to the second terminal of the circulator 62, a second terminal connected to the load, and a third terminal connected to the dummy load 72. Therefore, the microwave R reflected by the load is supplied to only the dummy load 72, and the microwave M from the magnetron 2 is supplied in only the direction of the load from the reference signal supplier 6.

The dummy load 72 has a function of efficiently absorbing the electric power. The dummy load 72 has absorbing capacity which can withstand the maximum output power of the magnetron 2, so that it can be used even when the reflection from the load is total reflection.

The synchronous controller 11 detects the anode current and output power of the magnetron 2, and controls the impedance generator 5 and reference signal supplier 6 on the basis of the detection results. A microcomputer, sequencer, or the like is used as the synchronous controller 11. Details of the synchronous controller 11 will be explained later.

In the magnetron oscillator 1 having the arrangement as described above, the microwave M radiated inside the launcher 4 from the antenna 21 of the magnetron 2 is supplied to the load after passing through the circulators 62 and 71 via the impedance generator 5.

Also, the microwave R reflected by the load is supplied to the dummy load 72 by the circulator 71, and absorbed. Accordingly, it is possible to prevent an operation error of the reference signal oscillator 61 by preventing the microwave R reflected by the load from being supplied to the reference signal oscillator 61 by the circulator 62.

On the other hand, the reference signal S from the reference signal oscillator 61 is supplied to the launcher 4 via the impedance generator 5 by the circulator 62, and injected into the magnetron 2 from the antenna 21.

When the reference signal S is injected into the magnetron 2, the oscillation frequency of the magnetron 2 is drawn and locked to a frequency $F_0$ of the reference signal S (injection locking) if the oscillation frequency of the magnetron 2 is close to the frequency $F_0$ of the reference signal S and equations (1) and (2) hold. Since the reference signal S has high frequency stability, it is possible to lock the oscillation frequency of the magnetron 2 to the frequency $F_0$ of the reference signal S, thereby stabilizing the oscillation frequency of the magnetron 2.

In this embodiment, the load impedance of the magnetron 2 can be changed by using the impedance generator 5. When the load impedance changes, the oscillation frequency of the magnetron 2 changes by the pulling phenomenon when no injection locking is in operation. Therefore, the oscillation frequency of the magnetron 2 when no injection locking is in operation can be controlled by adjusting the load impedance by using the impedance generator 5.

This embodiment uses this principle to make the oscillation frequency of the magnetron 2 substantially equal to the frequency $F_0$ of the reference signal S when no injection locking is in operation. That is, the value of BW in equation (1) is decreased. In this manner, the value of G can be increased in relation to equation (1). This derives the following effects from equation (2).

(a) When an output power $P_o$ of the magnetron 2 is constant, the electric power of the reference signal S, i.e., an injection power $P_i$ can be decreased. That is, injection locking can be easily performed by the injection power $P_i$ which is much lower than, e.g., 1/100 or less the output power $P_o$ of the magnetron 2.

(b) When the injection power $P_i$ is constant, the output power $P_o$ of the magnetron 2 can be increased. That is, it is possible to broaden the range of the output power $P_o$ of the magnetron 2 within which injection locking is kept locked.

The change width of the oscillation frequency can be reduced by controlling the oscillation frequency by using the impedance generator. Consequently, the value of BW decreases, so even when the output power $P_o$ of the magnetron 2 is changed, it is possible to lock the oscillation frequency of the magnetron 2 to the frequency $F_0$ of the reference signal S, and broaden the range of the output power $P_o$ within which the oscillation frequency is stable.

Figure 2:
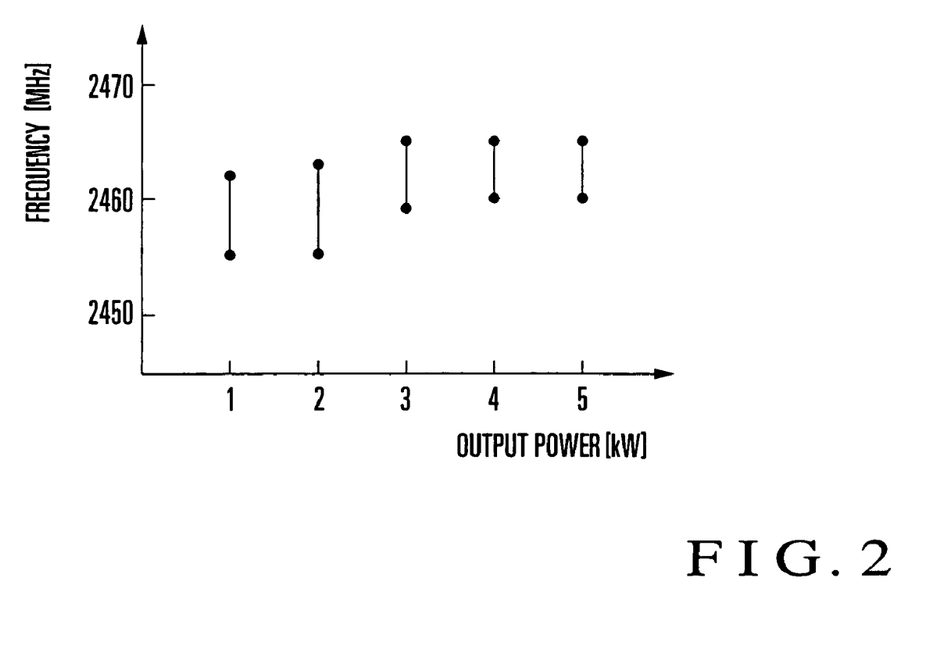
FIG. 2 is a graph showing the oscillation state of a magnetron when a load VSWR of the magnetron is made constant by an impedance generator and the load phase is changed.

FIG. 2 is a graph showing the oscillation state of the magnetron 2 when a load VSWR (Voltage Standing Wave Ratio) of the magnetron 2 is constant and the load phase is changed, i.e., shows the change in oscillation frequency range when the output power $P_o$ of the magnetron 2 is constant.

As indicated by this graph, even when the output power $P_o$ of the magnetron 2 is changed, the oscillation frequency of the magnetron 2 can be matched with the frequency $F_0$ of the reference signal S by adjusting the load impedance by using the impedance generator 5, and as a consequence the range of the output power $P_o$ within which injection locking is possible can be broadened.

Note that a Rieke diagram has a load impedance value with which the oscillation frequency of the magnetron 2 is constant regardless of the output power $P_o$ of the magnetron 2. Accordingly, the range of the output power $P_o$ within which the oscillation frequency is stable can be broadened by changing the load impedance in accordance with the output power $P_o$ of the magnetron 2.

The arrangements of the individual parts of the magnetron oscillator 1 according to this embodiment will be further explained below.

[Magnetron 2 and Magnetron Power Supply 3]

Figure 3:
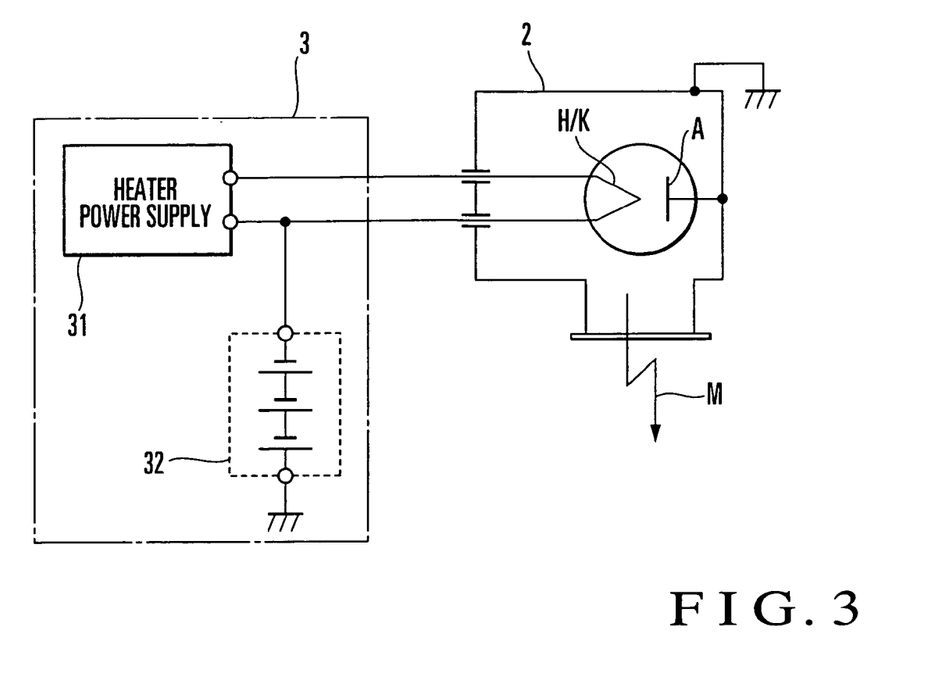
FIG. 3 is a block diagram showing the arrangements of the magnetron and a magnetron power supply.

FIG. 3 is a block diagram showing the arrangements of the magnetron 2 and magnetron power supply 3.

The magnetron 2 has a heater/cathode H/K obtained by integrating a heater and cathode, and an anode A. Although not shown, the anode A is divided into a plurality of portions, and these portions are connected by a vibration circuit (resonance circuit). The heater/cathode H/K is located concentrically with the anode A.

A heater power supply 31 of the magnetron power supply 3 is connected to the two terminals of the heater/cathode H/K. When the heater power supply 31 applies a heater voltage to the heater/cathode H/K, the heater/cathode H/K is heated, and electrons are emitted from the heater/cathode H/K.

An anode power supply 32 of the magnetron power supply 3 is also connected to one terminal of the heater/cathode H/K. When the anode power supply 32 applies a negative voltage to the heater/cathode H/K with respect to the anode A which is grounded, an electric field is formed between the heater/cathode H/K and anode A, and electrons are emitted from the heater/cathode H/K to the anode A.

When a magnetic field is applied in parallel to the heater/cathode H/K (in a direction perpendicular to the electric field) in this state, the microwave M oscillates.

When the magnetron 2 is operated as described above, of the electrons emitted from the heater/cathode H/K to the anode A, those having returned to the heater/cathode H/K collide against it, thereby causing a phenomenon in which the heater/cathode H/K is abnormally heated. This phenomenon is called "back heating". The stronger the oscillation, i.e., the higher the output power $P_o$, the more violently the back heating occurs, and the temperature of the heater/cathode H/K rises more than necessary.

The anode current increases in accordance with the output power $P_o$ of the magnetron 2. In this embodiment, therefore, heating of the heater/cathode H/K is suppressed by lowering the heater voltage in inverse proportion to the anode current by using the heater power supply 31.

Figure 4:
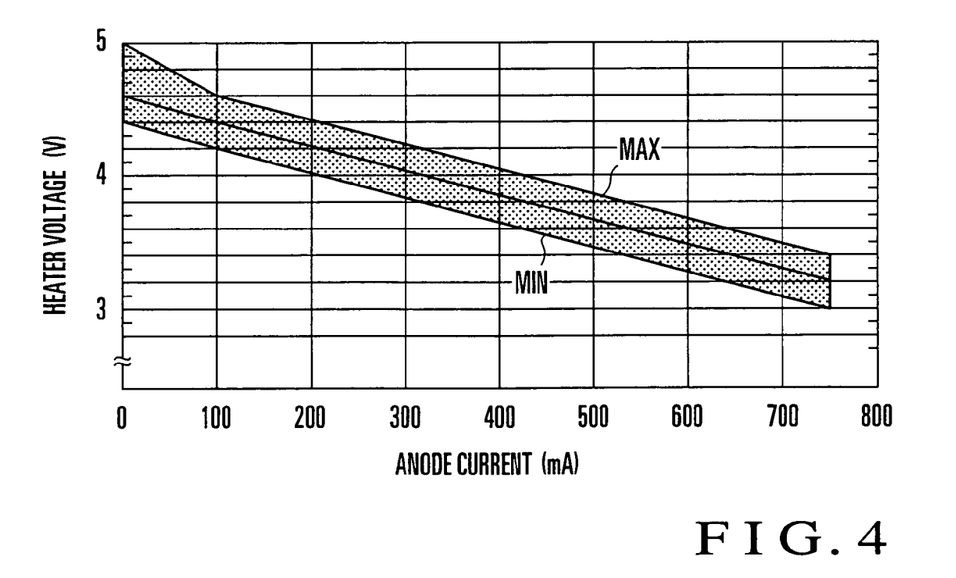
FIG. 4 is a graph showing the relationship between the anode current and heater voltage.

FIG. 4 is a graph showing the relationship between the anode current and heater voltage. "Max" and "Min" respectively represent the upper limit and lower limit of the heater voltage with respect to the anode current. Back heating can be prevented by controlling the heater voltage by using the heater power supply 31 in accordance with this graph.

[Impedance Generator 5]

An example of the arrangement of the waveguide type impedance generator 5 will be explained below.

Figure 5A:
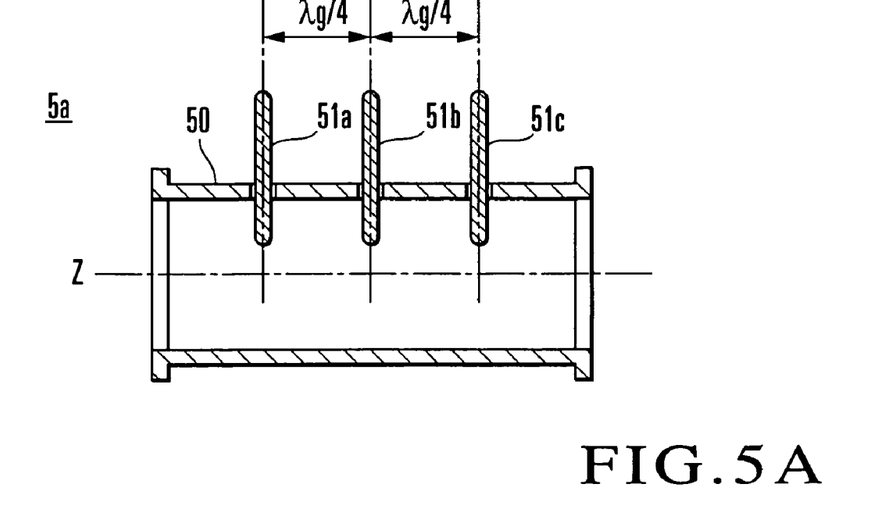
FIG. 5A is a sectional view showing an example of the arrangement of a reactance stub type impedance generator.

FIG. 5A is a sectional view showing an example of the arrangement of a reactance stub type impedance generator. An impedance generator 5a has a structure in which three stubs 51a, 51b, and 51c protrude into a rectangular waveguide 50 from its guide wall. The stubs 51a to 51c are located at an interval of, e.g., $\lambda g/8$ or $\lambda g/4$ in the direction of an axis Z of the rectangular waveguide 50. "$\lambda g$" is the guide wavelength of the rectangular waveguide 50. The subs 51a to 51c are made of a metal rod having a circular section. The reactances of the stubs 51a to 51c change in accordance with the length of protrusion into the rectangular waveguide 50, and the internal impedance of the rectangular waveguide 50 changes accordingly. Although the number of stubs need only be 1 or more, three stubs are mainly used. Also, the stubs are normally located on the H surface of the rectangular waveguide 50, but an E stub system in which they are located on the E surface may also be used.

Figure 5B:
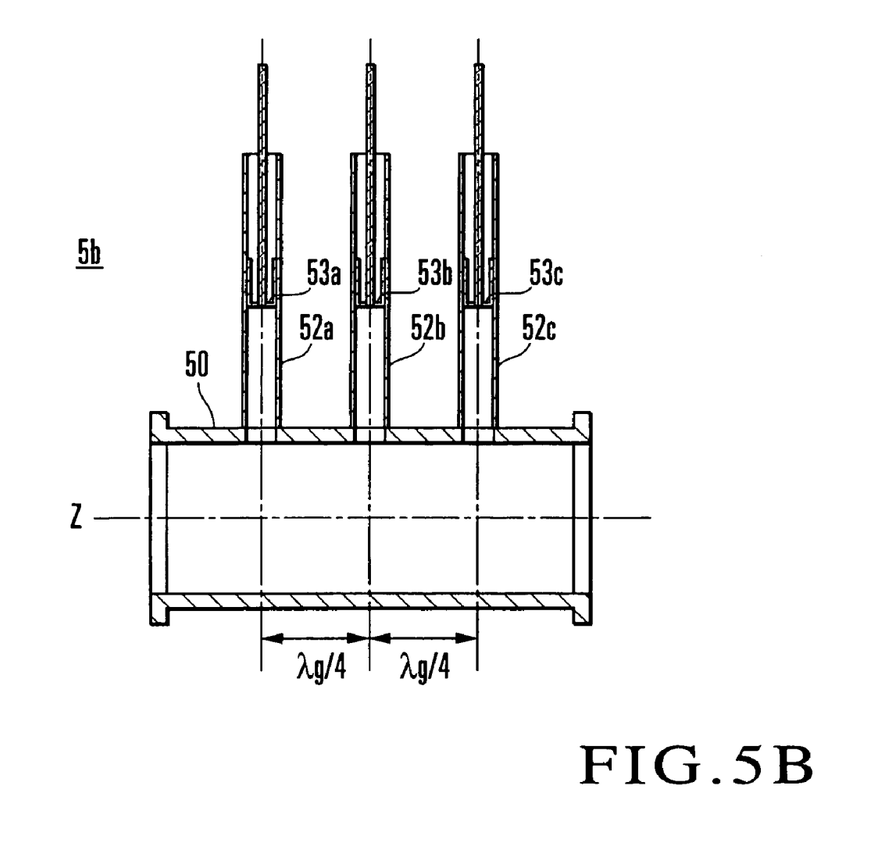
FIG. 5B is a sectional view showing an example of the arrangement of a waveguide branch type impedance generator.

FIG. 5B is a sectional view showing an example of the arrangement of a waveguide branch type impedance generator. An impedance generator 5b has a structure in which three branched waveguides 52a, 52b, and 52c are vertically connected to the guide wall of a rectangular waveguide 50. The branched waveguides 52a to 52c are located at an interval of, e.g., $\lambda g/8$ or $\lambda g/4$ in the direction of an axis Z of the rectangular waveguide 50. Each of the branched waveguides 52a to 52c has one end which is open in the rectangular waveguide 50, and the other end which is electrically functionally shorted by one of short plates 53a to 53c. When the length from one end to the other of each of the branched waveguides 52a to 52c is changed, the series reactance changes, and the internal impedance of the rectangular waveguide 50 changes.

It is also possible to use, as the impedance generator 5, a combination of a phase shifter and stub tuner, an impedance generator combining a 3-dB coupler and variable short device, a waveguide 4-branch tuner (see Reference 3 (Japanese Patent Laid-Open No. 2-249301)), or a slug tuner.

Also, the coaxial impedance generator 5 is obtained by replacing the rectangular waveguide of the above-mentioned waveguide system with a coaxial tube.

[Reference Signal Supplier 6]

Methods of amplifying the reference signal in the reference signal supplier 6 will be explained below. The reference signal amplification methods include a method using an amplifier and a method using injection locking.

Figure 6A:
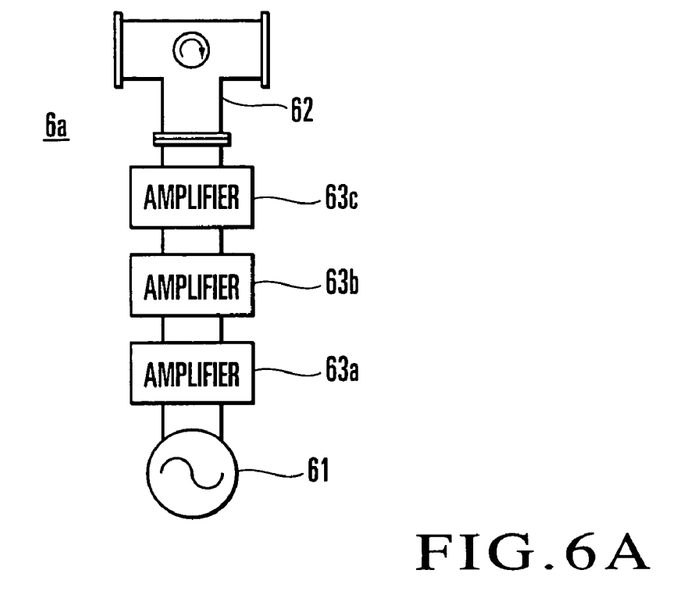
FIG. 6A is a view to explain an example of a method of amplifying a reference signal by using amplifiers.
Figure 6B:
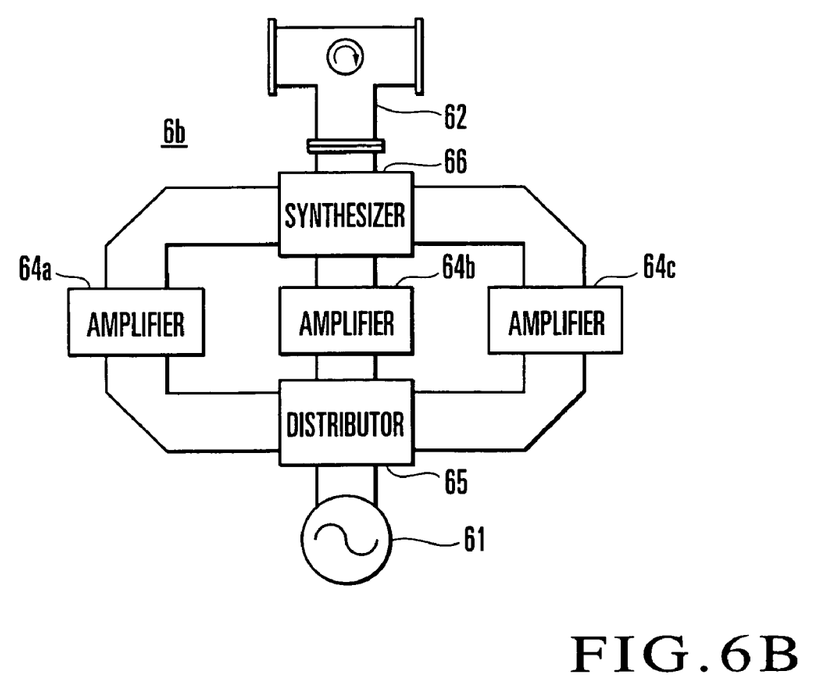
FIG. 6B is a view to explain another example of the method of amplifying a reference signal by using amplifiers.

FIGS. 6A and 6B are views to explain the method of amplifying the reference signal by using amplifiers.

When a plurality of amplifiers are to be used, as in a reference signal supplier 6a shown in FIG. 6A, the reference signal S having a desired electric power can be obtained by connecting a plurality of amplifiers 63a, 63b, and 63c in series, and sequentially amplifying the output power from the reference signal oscillator 61 by the amplifiers 63a to 63c.

As in a reference signal supplier 6b shown in FIG. 6B, the reference signal S having a desired electric power may also be obtained by connecting a plurality of amplifiers 64a, 64b, and 64c in parallel between a divider 65 and combiner 66, dividing the output electric power from the reference signal oscillator 61 to the amplifiers 64a to 64c by the divider 65, and combining the output electric powers from the amplifiers 64a to 64c by the combiner 66. In this case, each of the amplifiers 64a, 64b, and 64c may also be a plurality of series-connected amplifiers.

Figure 7:
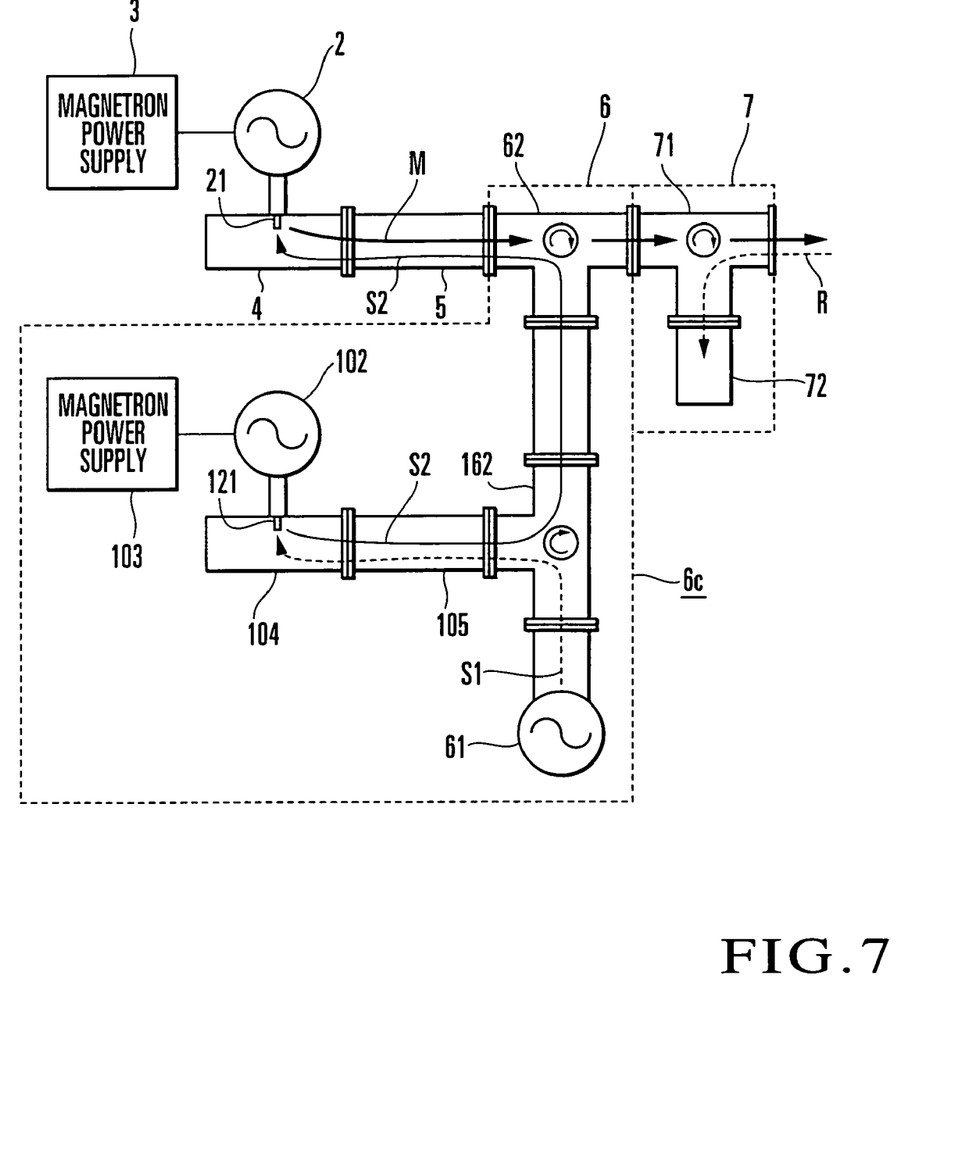
FIG. 7 is a view to explain a method of amplifying a reference signal by using injection locking.

FIG. 7 is a view to explain the method of amplifying the reference signal by using injection locking. In addition to the reference signal oscillator 61 and three-terminal circulator 62, a reference signal supplier 6c shown in FIG. 7 has a magnetron 102, magnetron power supply 103, launcher 104, impedance generator 105, and three-terminal circulator 162 respectively corresponding to the magnetron 2, magnetron power supply 3, launcher 4, impedance generator 5, and three-terminal circulator 62 of the magnetron oscillator 1.

The output power of the magnetron 102 is higher than that of the reference signal generator 61, and lower than that of the magnetron 2. A reference signal S1 from the reference signal oscillator 61 is injected into the magnetron 102 to lock the oscillation frequency of the magnetron 102 to the frequency of the reference signal S1. In this manner, a microwave S2 having high frequency stability similar to that of the reference signal S1 and an electric power higher than that of the reference signal S1 can be obtained from the magnetron 102. The microwave S2 is injected as a reference signal into the magnetron 2. Note that the impedance generator 105 may also be omitted.

Figure 8:
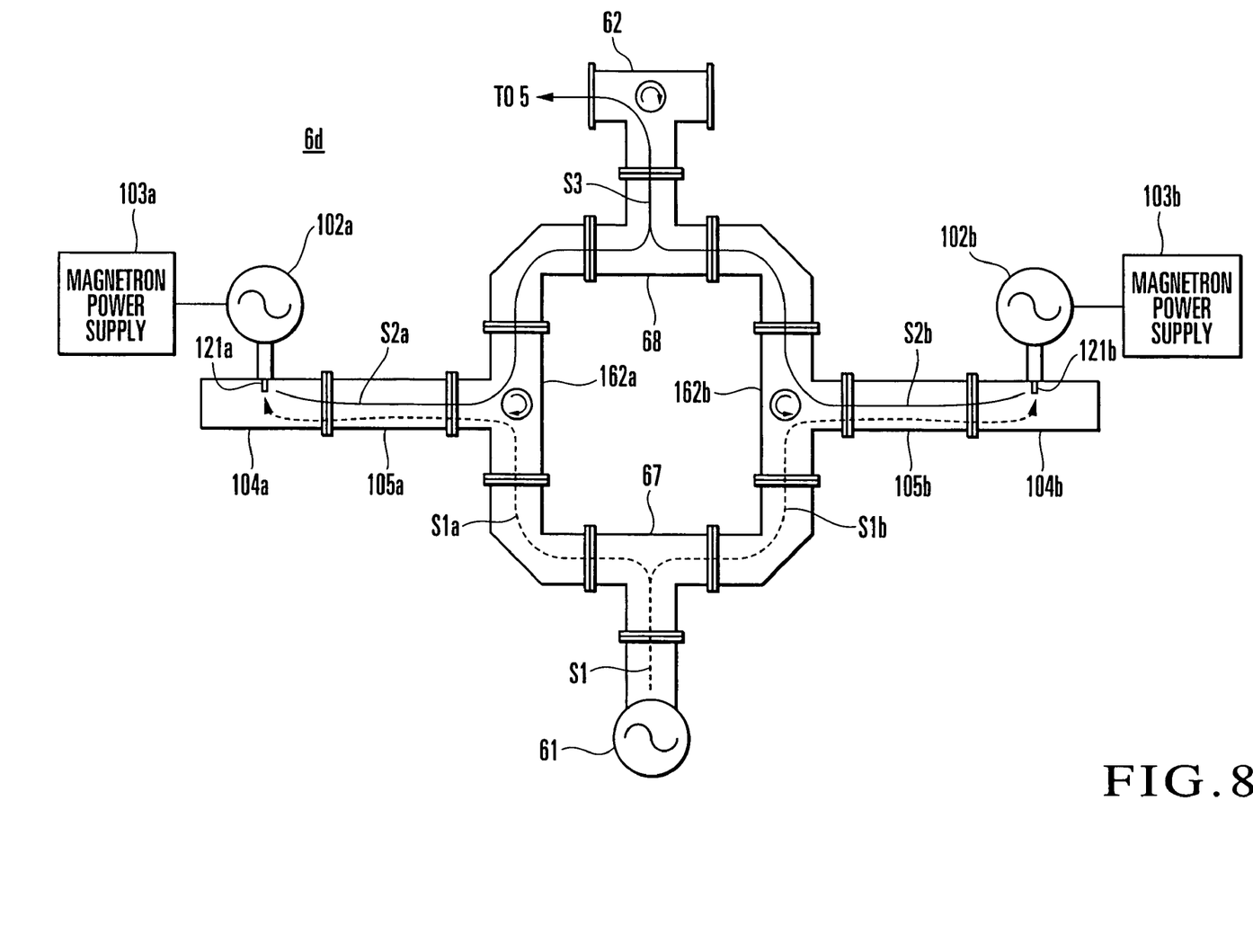
FIG. 8 is a view to explain a method of amplifying a reference signal by performing injection locking in parallel.

As in a reference signal supplier 6d shown in FIG. 8, it is also possible to form a plurality of structures each including the magnetron 102, magnetron power supply 103, launcher 104, impedance generator 105, and three-terminal circulator 162 shown in FIG. 7, and connect these structures in parallel between a divider 67 and combiner 68, thereby performing injection locking in parallel. In FIG. 8, reference symbols 102a and 102b denote magnetrons; 103a and 103b, magnetron power supplies; 104a and 104b, launchers; 105a and 105b, impedance generators; 162a and 162b, three-terminal circulators; S1a and S1b, reference signals respectively divided to the magnetrons 102a and 102b by the divider 67; S2a and S2b, microwaves respectively output from the magnetrons 102a and 102b; and S3, a microwave obtained by combining the microwaves S2a and S2b by the combiner 68. Note that the impedance generators 105a and 105b may also be omitted.

Since the reference signal is amplified as described above, a low-power oscillator can be used as the reference signal oscillator 61. A low-power oscillator is available at a low cost even though its frequency stability is high, so it is possible to suppress the manufacturing cost of the high-frequency-stability, high-power magnetron oscillator 1.

[Synchronous Controller 11]

Figure 9:
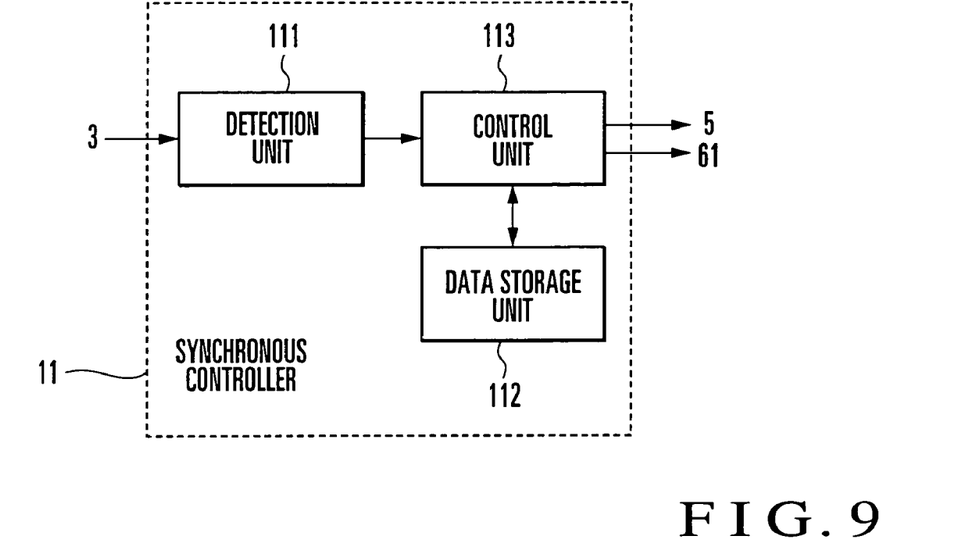
FIG. 9 is a block diagram showing the arrangement of a synchronous controller.

FIG. 9 is a block diagram showing the arrangement of the synchronous controller 11.

The synchronous controller 11 has a detection unit 111, data storage unit 112, and control unit 113.

The detection unit 111 is a circuit which detects the anode current supplied from the magnetron power supply 3 to the magnetron 2, and the output power from the magnetron power supply 3. The detection unit 111 can detect the anode current and output power at the same time or at different timings. Note that although FIG. 1 shows the example in which the output power from the magnetron 2 is detected by the launcher 4, the output power from the magnetron 2 may also be detected by connecting a directional coupler, probe, or the like to the load side of the reference signal supplier 6 or isolator 7.

The data storage unit 112 is a circuit which stores characteristic data obtained from the various characteristics such as the load characteristics and operation characteristics of the magnetron 2. Examples of the characteristic data stored in the data storage unit 112 are data which indicated that the relationship between the anode current and output power and the relationship between the anode current and oscillation frequency represented by a performance chart shown in FIG. 13, and data which indicated that the relationship between the load impedance and output power and the relationship between the load impedance and oscillation frequency represented by a Rieke diagram shown in FIG. 12. The data storage unit 112 also stores relations (1) and (2) of injection locking.

The controller 113 is a circuit which controls the impedance generator 5 and reference signal supplier 6 by referring to the stored contents of the data storage unit 112 on the basis of the detection results from the detection unit 111.

Normally, when the output power $P_o$ is increased by increasing the anode current of the magnetron 2, the value of G represented by equation (2) increases, and the value of BW represented by equation (1) decreases, so injection locking is readily disabled.

In this case, the synchronous controller 11 calculates the values of the load impedance and injection power $P_i$ capable of locking the oscillation frequency of the magnetron 2 to the frequency of the reference signal S, on the basis of the detected values of the anode current and output power of the magnetron 2, and outputs control signals to the impedance generator 5 and reference signal oscillator 61 so that the load impedance and injection power $P_i$ take these values. It is also possible to output control signals in accordance with a prepared correspondence table of the anode current and output power of the magnetron 2 and control signals, without calculating the load impedance and injection power $P_i$.

When the impedance generator 5 and reference signal oscillator 61 operate in accordance with the control signals, the load impedance of the magnetron 2 and the output power of the reference signal oscillator 61 are automatically adjusted in synchronism with the output power $P_o$ of the magnetron 2. Consequently, the oscillation frequency of the magnetron 2 when no injection locking is in operation approaches the frequency of the reference signal S, and the injection power $P_i$ increases to cause the value of G to decrease, so injection locking is maintained. Accordingly, even when the output power $P_o$ of the magnetron 2 is increased, injection locking is not disabled, so the range of the output power $P_o$ within which the oscillation frequency is stable can be broadened.

Although the example in which the synchronous controller 11 controls the impedance generator 5 and reference signal supplier 6 at the same time is explained, it is also possible to control one of the impedance generator 5 and reference signal supplier 6.

Also, the example in which the synchronous controller 11 detects the anode current and output power of the magnetron 2 and performs control on the basis of the detection results is explained, but the synchronous controller 11 may also detect one of the anode current and output power of the magnetron 2 and perform control on the basis of the detection result. In this case, the detection unit 111 of the synchronous controller 11 need only have a function of detecting one of the anode current and output power of the magnetron 2. Also, the correspondence table used to output control signals need only be a correspondence table of the anode current and a control signal or a correspondence table of the output power and a control signal.

[Modification of Magnetron Oscillator]

Figure 10:
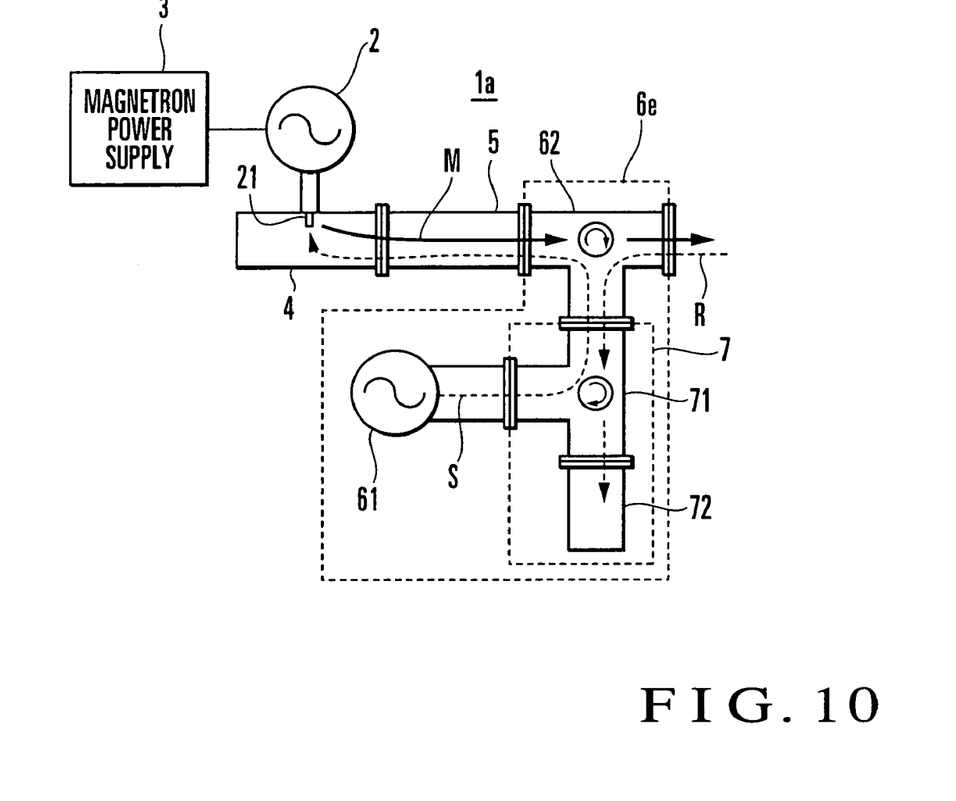
FIG. 10 is a block diagram showing a modification of the magnetron oscillator shown in FIG. 1.

FIG. 10 is a block diagram showing a modification of the magnetron oscillator shown in FIG. 1. In FIG. 10, the same reference numerals as in FIG. 1 denote the same or corresponding constituent members. Note that the synchronous controller 11 is omitted from FIG. 10.

A magnetron oscillator 1a shown in FIG. 10 differs from the magnetron oscillator 1 shown in FIG. 1 in position of the isolator 7. That is, in the magnetron oscillator 1a shown in FIG. 10, an isolator 7 including a three-terminal circulator 71 and dummy load 72 is formed in a reference signal supplier 6e.

More specifically, the first terminal of a three-terminal circulator 62 is connected to the other terminal of an impedance generator 5, a second terminal is connected to the load, and a third terminal is connected to a first terminal of the three-terminal circulator 71. Also, a second terminal of the three-terminal circulator 71 is connected to the dummy load 72, and the third terminal is connected to a reference signal oscillator 61.

Accordingly, a reference signal S from the reference signal oscillator 61 is supplied to the impedance generator 5 via the three-terminal circulators 71 and 62. Also, a microwave M from a magnetron 2 is supplied from the impedance generator 5 to the load via the three-terminal circulator 62. In addition, a microwave R reflected by the load is supplied to the dummy load 72 via the three-terminal circulators 62 and 71.

The propagation path of the microwave M oscillated by the magnetron 2 passes through the two circulators 62 and 71 before the microwave M reaches the load in the magnetron oscillator 1 shown in FIG. 1, but passes through the circulator 62 alone in the magnetron oscillator 1a shown in FIG. 10. The insertion loss of a circulator is generally about 0.5 dB. With the configuration of the magnetron oscillator 1a, therefore, the output power from the magnetron 2 can be efficiently supplied to the load.

An application example of the magnetron oscillator 1 (1a) according to this embodiment will now be explained.

[Plasma Processor]

Figure 11:
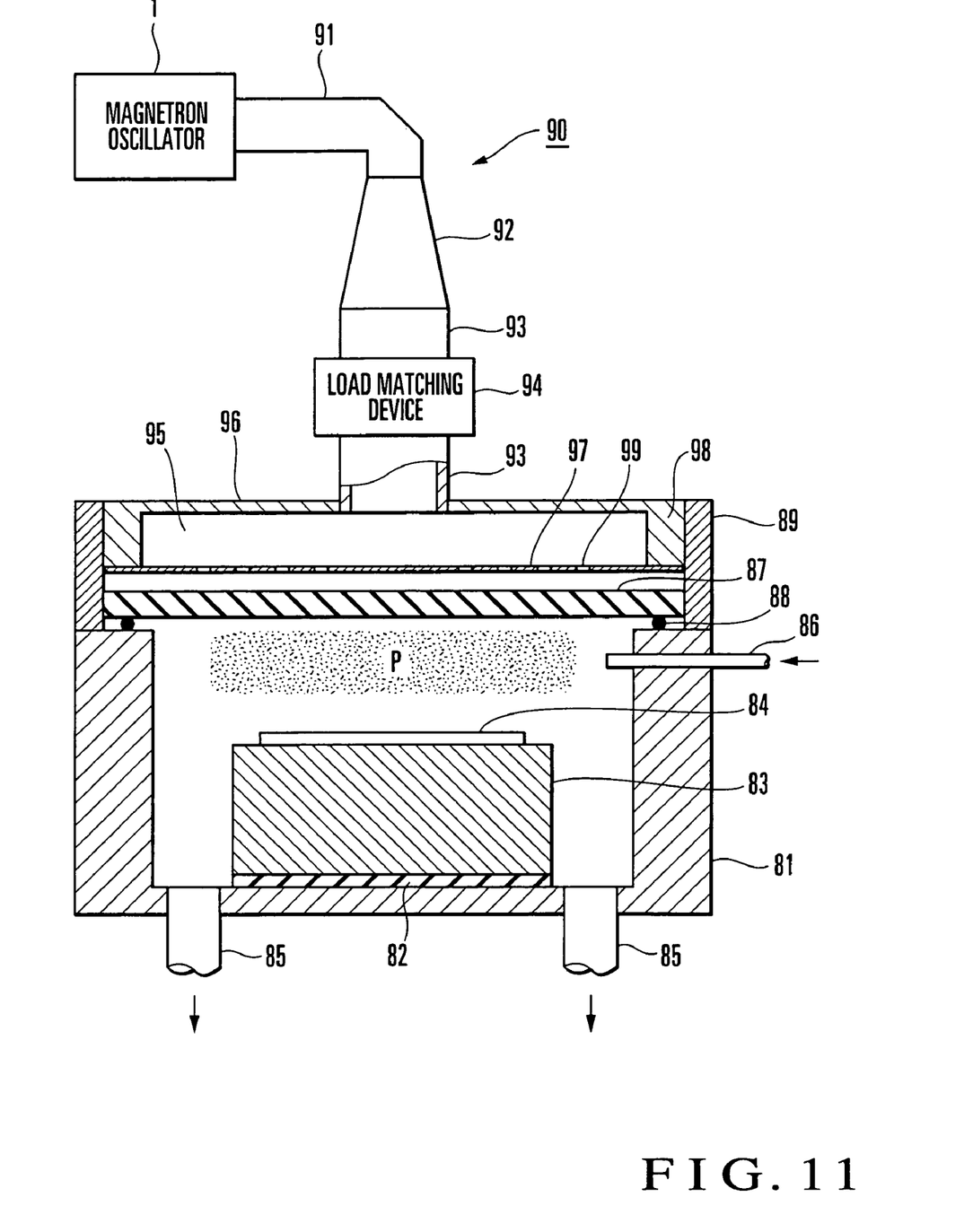
FIG. 11 is a view showing an example of the arrangement of a plasma processor using the magnetron oscillator according to the embodiment of the present invention.

The magnetron oscillator 1 (1a) can be used as a microwave power supply of a plasma processor. FIG. 11 is a view showing an example of the arrangement of a plasma processor using the magnetron oscillator 1 (1a).

This plasma processor shown in FIG. 11 has a closed-end, cylindrical processing vessel 81 having an upper opening. A susceptor 83 is fixed to the central portion of the bottom surface of the processing vessel 81 via an insulating plate 82. A substrate 84 to be processed is placed on the upper surface of the susceptor 83.

An exhaust port 85 for evacuation is formed in the periphery of the bottom surface of the processing vessel 81. A gas supply nozzle 86 for supplying gases into the processing chamber 81 is formed in the circumferential wall of the processing chamber 81. When this plasma processor is to be used as an etching apparatus, for example, the nozzle 86 supplies a plasma gas such as Ar and an etching gas such as $CF_4$.

The upper opening of the processing vessel 81 is closed by a dielectric plate 87. Note that a sealing member 88 such as an O-ring is interposed between the upper surface of the circumferential wall of the processing vessel 81 and the dielectric plate 87, thereby ensuring airtightness in the processing vessel 81.

A radial line slot antenna (RLSA) 99 which is an antenna of a microwave supply apparatus 90 which supplies a microwave M into the processing vessel 81 is disposed above the dielectric plate 87. The circumferential surfaces of the RLSA 99 and dielectric plate 87 are covered with an annular shield member 89 placed on the circumferential wall of the processing vessel 81, thereby forming a structure in which the microwave supplied from the RLSA 99 into the processing vessel 81 does not leak outside.

The microwave supply apparatus 90 has the magnetron oscillator 1 (1a) as a microwave power supply, a rectangular waveguide 91 whose transmission mode is $TE_{10}$, a rectangle-cylinder converter 92 which converts the transmission mode from $TE_{10}$ to $TE_{11}$ or $TM_{01}$, a cylindrical waveguide 93 whose transmission mode is $TE_{11}$ or $TM_{01}$, a load matching device 94 built in the cylindrical waveguide 93, a radial waveguide 95 connected to the cylindrical waveguide 93, and the RLSA 99 built on the lower surface of the radial waveguide 95.

The radial waveguide 95 has two circular conductor plates 96 and 97 parallel to each other, and a conductor ring 98 which connects and shields the peripheries of the two conductor plates 96 and 97. The cylindrical waveguide 93 is connected to the central portion of the conductor plate 96 as the upper surface of the radial waveguide 95. Also, a plurality of slots are formed in the conductor plate 97 as the lower surface of the radial waveguide 95, and these slots form the RLSA 99.

When the magnetron oscillator 1 (1a) oscillates the microwave M in the plasma processor having the arrangement as described above, the microwave M is supplied to the radial waveguide 95 via the rectangular waveguide 91, rectangle-cylinder converter 92, and cylindrical waveguide 93. The microwave M supplied to the radial waveguide 95 radially propagates from the center to the periphery of the radial waveguide 95, and is gradually supplied into the processing vessel 81 from the RLSA 99 on the lower surface of the radial waveguide 95. In the processing vessel 81, the supplied microwave M generates a plasma P by ionizing a plasma gas supplied from the nozzle 86, thereby processing the substrate 84.

Since the magnetron oscillator 1 (1a) uses the magnetron 2 as an oscillating tube, it can be manufactured at a cost much lower than that of a semiconductor oscillator or klystron oscillator. Therefore, the manufacturing cost of the plasma processor can be suppressed by using the magnetron oscillator 1 (1a) as a microwave power supply of the plasma processor.

In addition, similar to a semiconductor oscillator and klystron oscillator, the magnetron oscillator 1 (1a) has high frequency stability and causes no moding. Accordingly, the operation of the plasma processor including many frequency-dependent elements can be stabilized and made constant. Also, since the band characteristics need not be taken into consideration, the design of, e.g., discharge electrodes (in this embodiment, the radial waveguide 95 and RLSA 99) of the plasma processor is facilitated.

Note that the magnetron oscillator 1 (1a) may also be used in other types of plasma processors. For example, the magnetron oscillator 1 (1a) can be used in an ECR (Electron-Cyclotron-Resonance) plasma processor.

[Communication etc.]

A magnetron oscillator using a magnetron which continuously oscillates similarly to the magnetron 2 used in this embodiment is conventionally regarded as unsuitable for communication and the like due to the characteristics of the magnetron. Since, however, the frequency stability can be improved by this embodiment, it may be possible to use a magnetron oscillator in, e.g., communication or a medical accelerator.

Presently, a klystron is used as an oscillating tube in, e.g., communication or a medical accelerator. This klystron is very expensive. Therefore, if a magnetron can be used in, e.g., communication or a medical accelerator, the far-reaching effect is very large.

In the present invention as described above, the oscillation frequency of a magnetron is locked to the frequency of a reference signal by injecting the reference signal into the magnetron. Since the frequency of the reference signal is stabler than the oscillation frequency of the magnetron, the frequency stability of the magnetron oscillator can be improved. Since no moding occurs as well, a matching circuit or the like connected to the load can be normally operated.

Also, in the present invention, the load impedance of the magnetron can be changed by using the impedance generator. When the load impedance of the magnetron is changed, the oscillation frequency of the magnetron changes on the basis of the pulling phenomenon. Accordingly, the change width of the oscillation frequency can be reduced by adjusting the load impedance by using the impedance generator.

That is, the change width of the oscillation frequency of the magnetron can be reduced in accordance with the output power of the magnetron by previously adjusting the load impedance of the magnetron to a specific value on a Rieke diagram.

In the present invention, therefore, even when the output power of the magnetron is changed, it is possible to lock the oscillation frequency to the frequency of the reference signal, and broaden the output power range within which the oscillation frequency is stable.

The output power range within which the oscillation frequency is stable can be further broadened by changing at least one of the load impedance of the magnetron and the reference signal in synchronism with the output power of the magnetron.

In addition, since the magnetron is used as an oscillating tube in the present invention, the oscillator can be manufactured at a cost much lower than that of a semiconductor oscillator or klystron oscillator. Although a reference signal oscillator having high frequency stability is used in the present invention as well, this reference signal oscillator has a low output power and is inexpensive, so the manufacturing cost of the whole apparatus does not largely increase. When the reference signal from the reference signal oscillator is amplified by an amplifier or by a magnetron whose output power is lower than that of the above-mentioned magnetron, it is possible to use a reference signal oscillator which is lower in output power and cost than the above-mentioned reference signal oscillator, and suppress the manufacturing cost of the entire apparatus.

Also, in the present invention, the use of the isolator makes it possible to prevent an operation error of the reference signal oscillator by preventing the reflected electric power from being supplied from the load to the reference signal oscillator.

In addition, in the present invention, the voltage to be applied to the heater is decreased as the electric current flowing through the cathode increases, thereby suppressing abnormal heating of the cathode caused by collision of electrons having returned to the cathode after being emitted from the cathode to the anode.

Furthermore, in the present invention, the magnetron oscillator described above is used in a plasma processor to supply a microwave having a stable frequency, so the operation of the plasma processor including many frequency-dependent elements can be stabilized and made constant. Also, the design of discharge electrodes or the like of the plasma processor is facilitated because the band characteristics need not be taken into consideration.

The invention claimed is:

1. A magnetron oscillator characterized by comprising:
   a first magnetron;
   a launcher which extracts an output power of said first magnetron;
   an impedance generator which has one terminal connected to an output terminal of said launcher, and adjusts a load impedance of said first magnetron; and
   a reference signal supplier which is connected to the other terminal of said impedance generator, and supplies, to said first magnetron, a reference signal lower in electric power and stabler in frequency than the output from said first magnetron, characterized in that at least one of the load impedance of said first magnetron and the electric power of the reference signal supplied from said reference signal supplier changes in synchronism with the output power of said first magnetron.

2. A magnetron oscillator characterized by comprising:
   a first magnetron;
   a launcher which extracts an output power of said first magnetron;
   an impedance generator which has one terminal connected to an output terminal of said launcher, and adjusts a load impedance of said first magnetron; and
   a reference signal supplier which is connected to the other terminal of said impedance generator, and supplies, to said first magnetron, a reference signal lower in electric power and stabler in frequency than the output from said first magnetron, characterized by further comprising a synchronous controller which controls at least one of said impedance generator and said reference signal supplier on the basis of at least one of an anode current and the output power of said first magnetron.

3. A magnetron oscillator according to claim 2, characterized in that said synchronous controller comprises:
   a detection unit which detects at least one of the anode current and output power of said first magnetron;
   a data storage unit which stores characteristic data of said first magnetron; and
   a control unit which controls at least one of said impedance generator and said reference signal supplier by referring to the characteristic data stored in said data storage unit on the basis of a detection result from said detection unit.

4. A magnetron oscillator according to claim 1 or claim 2, characterized in that said reference signal supplier comprises:
   a reference signal oscillator which oscillates the reference signal; and
   an irreversible member which guides the reference signal from said reference signal oscillator to said impedance generator, and guides the output power of said first magnetron, which is supplied from said impedance generator, in a direction of a load.

5. A magnetron oscillator according to claim 4, characterized in that said irreversible member is one of a circulator, a directional coupler, and a branching/coupling device.

6. A magnetron oscillator according to claim 4, characterized in that said reference signal supplier further comprises an amplifier which amplifies the reference signal from said reference signal oscillator.

7. A magnetron oscillator according to claim 6, characterized in that said amplifier comprises a plurality of amplifiers, and said plurality of amplifiers are connected in series or parallel.

8. A magnetron oscillator according to claim 4, characterized in that said reference signal supplier further comprises a second magnetron having an output power higher than that of said reference signal oscillator and lower than that of said first magnetron, and supplies, to said first magnetron, an output power of said second magnetron having an oscillation frequency locked to a frequency of the reference signal by injection of the reference signal.

9. A magnetron oscillator according to claim 1 or claim 2, characterized by further comprising an isolator which is connected between said reference signal supplier and a load, absorbs a reflected power from said load, and guides the output power of said first magnetron, which is supplied from said reference signal supplier, in a direction of said load.

10. A magnetron oscillator according to claim 9, characterized in that said isolator comprises:
    a dummy load which absorbs an electric power; and
    a circulator which guides the reflected power from said load to said dummy load, and guides the output power of said first magnetron, which is supplied from said reference signal supplier, in a direction of said load.

11. A magnetron oscillator according to claim 1 or claim 2, characterized in that said reference signal supplier comprises:
    a reference signal oscillator which oscillates the reference signal;
    an isolator having one terminal connected to said reference signal oscillator; and
    an irreversible member connected to the other terminal of said isolator, the other terminal of said impedance generator, and a load, said irreversible member guides the output power of said first magnetron, which is supplied from said impedance generator, in a direction of said load, and guides a reflected power from said load to said isolator, said isolator absorbs the reflected power from said irreversible member, and guides the reference signal from said reference signal oscillator to said irreversible member, and said irreversible member further guides the reference signal from said isolator to said impedance generator.

12. A magnetron oscillator according to claim 1 or claim 2, characterized in that said first magnetron comprises a cathode which emits electrons when heated, a heater which heats said cathode in accordance with an applied voltage, and an anode which forms an electric field with respect to said cathode, and said magnetron oscillator further comprises a heater power supply which decreases the voltage to be applied to said heater as an electric current flowing through said anode increases.

13. A magnetron oscillator according to claim 1 or claim 2, characterized by being used as a microwave power supply of a plasma processor which performs predetermined processing on an object to be processed, by using a plasma generated by a microwave.

* * * * *